United States Patent
Kim et al.

(10) Patent No.: US 11,152,354 B2
(45) Date of Patent: Oct. 19, 2021

(54) BIPOLAR JUNCTION TRANSISTOR, BICOMOS DEVICE INCLUDING SAME, AND METHOD OF MANUFACTURING BICMOS DEVICE

(71) Applicant: DB HiTek Co., Ltd., Seoul (KR)

(72) Inventors: Hyun-Jin Kim, Seoul (KR); Sang-Gil Kim, Iksan-si (KR); Seung-Hyun Eom, Chungcheongbuk-do (KR); Yong-Jin Kim, Cheongju-si (KR)

(73) Assignee: DB HiTek Co., Ltd., Seoul (KR)

( * ) Notice: Subject to any disclaimer, the term of this patent is extended or adjusted under 35 U.S.C. 154(b) by 0 days.

(21) Appl. No.: 16/868,278

(22) Filed: May 6, 2020

(65) Prior Publication Data

US 2020/0357790 A1 Nov. 12, 2020

(30) Foreign Application Priority Data

May 8, 2019 (KR) .................. 10-2019-0053670

(51) Int. Cl.
| | |
|---|---|
| H01L 27/06 | (2006.01) |
| H01L 29/06 | (2006.01) |
| H01L 21/265 | (2006.01) |
| H01L 21/8249 | (2006.01) |
| H01L 21/285 | (2006.01) |
| H01L 29/45 | (2006.01) |

(52) U.S. Cl.
CPC .... *H01L 27/0623* (2013.01); *H01L 21/26513* (2013.01); *H01L 21/28518* (2013.01); *H01L 21/8249* (2013.01); *H01L 29/0649* (2013.01); *H01L 29/45* (2013.01)

(58) Field of Classification Search
CPC .......... H01L 27/0623; H01L 21/26513; H01L 21/28518; H01L 21/8249; H01L 29/0649; H01L 29/45
USPC ......... 257/378, 370; 438/202, 205, 234, 309
See application file for complete search history.

(56) References Cited

U.S. PATENT DOCUMENTS

| | | | |
|---|---|---|---|
| 9,666,700 B2 | 5/2017 | Hebert et al. | |
| 2007/0148849 A1* | 6/2007 | Yun ................ | H01L 27/0623 438/199 |
| 2015/0243770 A1 | 8/2015 | Hebert et al. | |

FOREIGN PATENT DOCUMENTS

KR 10-2015-0099666 A 9/2015

OTHER PUBLICATIONS

Francois Hebert et al.; "Verticle Bipolar Junction Transistor and Manufacturing Method Thereof"; Bibliographic data of KR20150099666 (A); Sep. 1, 2015; 2 pgs.; https://worldwide.espacenet.com.

\* cited by examiner

*Primary Examiner* — Thinh T Nguyen
(74) *Attorney, Agent, or Firm* — Andrew D. Fortney; Central California IP Group, P.C.

(57) ABSTRACT

A bipolar junction transistor, a BiCMOS device including same, and a method of manufacturing the BiCMOS device are disclosed. To fabricate the BiCMOS device, a bipolar region and a CMOS region are on a lightly doped substrate to enhance isolation between devices. First-conductivity-type deep well regions are in the bipolar region and/or the CMOS region to prevent well-to-substrate diffusion.

12 Claims, 5 Drawing Sheets

BIPOLAR JUNCTION TRANSISTOR, BICOMOS DEVICE INCLUDING SAME, AND METHOD OF MANUFACTURING BICMOS DEVICE

CROSS REFERENCE TO RELATED APPLICATION

The present application claims priority to Korean Patent Application No. 10-2019-0053670, filed May 8, 2019, the entire contents of which are incorporated herein for all purposes by this reference.

BACKGROUND OF THE INVENTION

1. Field of the Invention

Embodiments of the present disclosure relate to a bipolar junction transistor, a BiCMOS device including the same, and a method of manufacturing the same. More particularly, embodiments of the present disclosure relate to a bipolar junction transistor and a BiCMOS device, each of which include a bipolar region and a CMOS region in a lightly doped substrate to enhance isolation characteristics between devices, and first-conductivity-type deep well regions in the bipolar region and the CMOS region, respectively, to prevent wide well-to-substrate diffusion. In addition, embodiments of the present disclosure also relate a method of manufacturing the BiCMOS device.

2. Background Art

Bipolar junction transistors (BJTs) display less noise, a wider band of linear gain, faster frequency response, and higher current-drive performance than metal-oxide-semiconductor field-effect transistors (MOSFETs). To attain both the advantageous characteristics of BJTs and the strengths of MOSFETs, BiCMOS technology that combines BJTs and CMOS devices in a single integrated circuit chip has been proposed. Typically, BiCMOS technology adds process steps that form bipolar junction transistors to a baseline CMOS process.

A BiCMOS device consists of a CMOS region and a bipolar region, divided by an isolation layer. To fabricate BiCMOS devices, heavily doped substrates having a boron (B) concentration of 1e15/cm² are typically used.

However, there is a different approach that uses lightly doped substrates to prevent interference between the bipolar region and the CMOS region. Such lightly doped substrates have high resistivity, thereby enhancing isolation between devices formed therein. However, depending on conditions, there are cases where lightly doped substrates result in deterioration in isolation between devices formed therein.

For example, in forward active mode of a bipolar junction transistor formed in a lightly doped substrate, the base-emitter junction is forward-biased, and the collector-emitter junction is reverse-biased. In this state, electrons are injected into a base contact region from the emitter region, and the electrons may pass through or into a first-conductivity-type well region and enter a collector contact region. In this case, there is a chance that a fraction of the electrons coming out of the collector region will enter the lightly doped substrate and reach a nearby PMOS region within a CMOS region. This is because there may not be sufficient holes in the lightly doped substrate to combine with all of the incoming electrons. Therefore, contrary to the expected effects of a lightly doped substrate, the reliability of devices formed on and/or in a lightly doped substrate may deteriorate due to interference between bipolar junction transistors and CMOS devices. That is, there is a problem in that the lightly doped first-conductivity-type substrates may deteriorate the isolation between devices in a bipolar region and a CMOS region, rather than improve such isolation characteristics.

In order to solve the above-mentioned problem, the present disclosure includes a bipolar transistor and a BiCMOS device including the same, on and/or in a lightly doped substrate, in which highly doped first-conductivity-type well regions (for example, P well regions) are folioed in a bipolar region and/or a CMOS region to enhance isolation between devices on and/or in the lightly doped substrate, while preventing negative effects of the lightly doped substrate.

SUMMARY OF THE DISCLOSURE

The present disclosure has been made in view of the problem(s) occurring in the related art, and one objective of the present disclosure is to provide a bipolar junction transistor capable of enhancing isolation characteristics between devices by using a lightly doped substrate and an intrinsic epitaxial layer, a BiCMOS device including the same, and a method of manufacturing the same.

Another objective of the present disclosure is to provide a bipolar transistor, a BiCMOS device including the bipolar transistor, and a method of manufacturing the BiCMOS device, all of which are capable of preventing inter-device noise that arises due to the use of a lightly doped substrate and an intrinsic epitaxial layer, by including a second deep well region (which comprises a first-conductivity-type heavily doped region in the epitaxial layer) in a bipolar region. The second deep well region essentially surrounds a second well region and a first deep well region (which comprise second-conductivity-type regions) and optionally a buried layer (which may also comprise a second-conductivity-type region).

A further objective of the present invention is to provide a bipolar junction transistor, a BiCMOS device including the bipolar junction transistor, and a method of manufacturing the BiCMOS device, all of which are capable of enhancing isolation between devices by including a third deep well region having a first conductivity type in an epitaxial layer in a CMOS region, the third deep well region surrounding a second-conductivity-type well region.

A yet further objective of the present invention is to provide a bipolar junction transistor, a BiCMOS device including the bipolar junction transistor, and a method of manufacturing the BiCMOS device, all of which are capable of maintaining a low concentration and a high electrical resistance of an epitaxial layer, by including a second deep well region and a third deep well region that are horizontally spaced or apart from each other and a predetermined distance from the boundary between a bipolar region and a CMOS region.

A yet further objective of the present invention is to provide a bipolar junction transistor, a BiCMOS device including the bipolar junction transistor, and a method of manufacturing the BiCMOS device, all of which are capable of electrically shielding devices from each other to prevent leakage current, by including a second-conductivity-type buried layer (e.g., an NBL) between a second well region and a first deep well region.

A yet further objective of the present invention is to provide a bipolar junction transistor, a BiCMOS device including the bipolar junction transistor, and a method of manufacturing the BiCMOS device, all of which are capable of maintaining a lightly doped state of a substrate by eliminating a conventional first-conductivity-type buried layer.

The objectives of the present invention can be implemented with one or more embodiments as described below. According to various embodiments of the present invention, there is provided a bipolar junction transistor including a substrate; an intrinsic epitaxial layer on the substrate; a first well region in the intrinsic epitaxial layer and having a first conductivity type (e.g., serving as a base region); a second well region having a second conductivity type and adjacent to at least one side of the first well region; a first deep well region having the second conductivity type, the first deep well region being below the first and second well regions and in the intrinsic epitaxial layer; an emitter region and a base contact in the first well region, the emitter region and the base contact having the second conductivity type and the first conductivity type, respectively; a collector contact in the second well region and having the second conductivity type; and a second deep well region in a bipolar region of the intrinsic epitaxial layer and having the first conductivity type.

According to further embodiments of the present invention, in the bipolar junction transistor, the first well region and the second well region may be spaced from each other.

According to even further embodiments of the present invention, in the bipolar junction transistor, the substrate may have an electrical resistance exceeding 1 KΩ·cm.

According to yet further embodiments of the present invention, in the bipolar junction transistor, the second deep well region may surround the second well region and the first deep well region.

According to yet further embodiments of the present invention, the bipolar junction transistor may further include a buried layer below the first deep well region and having the second conductivity type, and the second deep well region may surround the second well region, the first deep well region, and the buried layer.

According to yet further embodiments of the present invention, the bipolar junction transistor may further comprise one or more first isolation layers between the emitter region, the base contact, and the collector contact (e.g., the emitter region, the base contact, and the collector contact may be separated from one another by respective first isolation layers).

According to yet further embodiments of the present invention, there is provided a BiCMOS device including a bipolar junction transistor in a bipolar region, a CMOS device in a CMOS region, and a second isolation layer separating the bipolar region from the CMOS region, in which the CMOS device includes a third well region of a second conductivity type in an epitaxial layer, a fourth well region of a first conductivity type in the epitaxial layer, and a third deep well region of the first conductivity type in the epitaxial layer, surrounding the third and fourth well regions, and having a same doping concentration as the second deep well region.

According to yet further embodiments of the present invention, there is provided a BiCMOS device including a substrate; an intrinsic epitaxial layer on the substrate; a first well region having a first conductivity type and serving as a base region, the first well region being in a bipolar region of the intrinsic epitaxial layer; a second well region having a second conductivity type and being adjacent to at least one side of the first well region, the second well region being in the bipolar region; a first deep well region in the bipolar region, below the first and second well regions, and having the second conductivity type; an emitter region and a base contact in the first well region, the emitter region and the base contact having the second conductivity type and the first conductivity type, respectively; a collector contact in the second well region and having the second conductivity type; a second deep well region having the first conductivity type, in the bipolar region and surrounding the second well region and the first deep well region; a third well region in a CMOS region of the epitaxial layer and having the second conductivity type; a fourth well region in the CMOS region of the epitaxial layer and having the first conductivity type, the fourth well region being spaced from the third well region; and a third deep well region in the CMOS region of the epitaxial layer, surrounding the third well region, and having the first conductivity type, in which the second deep well region and the third deep well region are more heavily doped than the substrate (e.g., have a higher dopant concentration than the substrate).

According to yet further embodiments of the present invention, in the BiCMOS device, the second deep well region and the third deep well region may be spaced from each other and may be a predetermined distance from a boundary between the bipolar region and the CMOS region.

According to yet further embodiments of the present invention, in the BiCMOS device, the substrate may have an electrical resistance exceeding 1 KΩ·cm.

According to yet further embodiments of the present invention, the BiCMOS device may further include first isolation layers that separate the emitter region, the base contact, and the collector contact from one another; and one or more silicide films on the emitter region, the base contact, and the collector contact.

According to yet further embodiments of the present invention, the BiCMOS device may further include a second isolation layer in the epitaxial layer at the boundary between the bipolar region and the CMOS region.

According to yet further embodiments of the present invention, there is provided a method of manufacturing a BiCMOS device, including forming an intrinsic epitaxial layer on a lightly doped substrate; forming a first well region having a first conductivity type in a bipolar region of the epitaxial layer; forming a first-conductivity-type doped region (e.g., for a second-conductivity-channel MOS device) in the CMOS region; forming a first deep well region having a second conductivity type below the first well region in the bipolar region; forming a second well region having the second conductivity type at one side of the first well region in the bipolar region; forming a second-conductivity-type doped region (e.g., for a first-conductivity-channel MOS device) in the CMOS region of the epitaxial layer, the second-conductivity-type doped region being spaced from the first-conductivity-type doped region; and forming a second deep well region having the first conductivity type in the bipolar region of the epitaxial layer, surrounding the second well region and the first deep well region.

According to yet further embodiments of the present invention, the method may further include forming a third deep well region having the first conductivity type in the CMOS region, surrounding the second-conductivity-type doped region.

According to yet further embodiments of the present invention, in the method, the second deep well region and the third deep well region may be formed using the same process or process steps, and may be spaced from a boundary between the bipolar region and the CMOS region.

According to yet further embodiments of the present invention, the method may further include forming a buried layer having the second conductivity type in the bipolar region by implanting second-conductivity-type impurity ions in the substrate.

According to yet further embodiments of the method, the first deep well region may be folioed between the second deep well region and the buried layer.

According to yet further embodiments of the present invention, the method may further include forming an emitter region having the first conductivity type in an upper portion of the first well region; forming a collector contact having the first conductivity type in an upper portion of the second well region; forming a base contact having the second conductivity type in an upper portion of the first well region; forming a first isolation layer in the intrinsic epitaxial layer, configured to separate the emitter region, the collector contact, and the base contact; and forming a second isolation layer at a boundary between the bipolar region and the CMOS region.

According to yet further embodiments of the present invention, the third deep well region may be formed in the epitaxial layer surrounding the second-conductivity-type doped region and the first-conductivity-type doped region.

According to yet further embodiments of the present invention, the second deep well region may be more heavily doped than the substrate.

With the configurations described above, the following effects can be attained.

According to the present invention, with the use of the lightly doped substrate and the intrinsic epitaxial layer in combination, it is possible to enhance isolation between devices.

In addition, since the second deep well region (which is a first-conductivity-type heavily doped region) is formed in the bipolar region of the epitaxial layer and surrounding the second well region, the first deep well region, and the buried region (all of which are second-conductivity-type regions), it is possible to reduce or prevent occurrence of noise, while using the lightly doped substrate and the intrinsic epitaxial layer in combination.

In addition, since the third deep well region having the first conductivity type is in the CMOS region of the epitaxial layer and surrounding the second-conductivity-type well region, it is possible to enhance isolation between devices.

In addition, since the second deep well region and the third deep well region are horizontally spaced from each other and are a predetermined distance from the boundary between the bipolar region and the CMOS region, it is possible to maintain a low dopant concentration in and a high electrical resistance of the epitaxial layer.

In addition, since the second-conductivity-type buried layer is preferably between the second well region and the first deep well region, it is possible to enhance isolation between devices and reduce or prevent leakage current.

In addition, since a conventional first-conductivity-type buried layer (e.g., a PBL) can be eliminated, it is possible to maintain the lightly doped state of the substrate.

Although some effects are not mentioned above, when those effects and the potential effects thereof are provided or expected to be provided by the detailed technical features of the present invention (which will be described below), it is noted that those effects and the potential effects are regarded to be described herein.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Herein below, exemplary embodiments of the present disclosure will be described in detail with reference to the accompanying drawings, wherein the exemplary embodiments may be modified in a variety of other forms. Accordingly, the scope of technical protection of the claimed invention may be determined by the technical idea of the appended claims. In addition, the exemplary embodiments are merely provided for reference to more fully describe the present invention to those skilled in the art.

In the following description, when a component is described as being on another component, it should be understood that the component may be directly on (e.g., the surface of) the other component, or it may be indirectly on (e.g., a predetermined distance from the surface of) the other component. When one component is a predetermined distance from the other component, an intermediate component may be between the two components. However, when one component is directly on the surface of another component, an intermediate component cannot be therebetween.

Terms used in the specification, such as "first", "second", etc., can be used to discriminate one component from another component, but the order or priority of the components is not limited unless specifically stated. In addition, it should be noted that when a "second" component is described as being present, it does not mean that a "first" component is necessarily present.

When various embodiments can be implemented differently, functions or operations specified in specific blocks may occur in a different sequence (e.g., from the flowchart). For example, functions or operations specified in consecutive two steps or blocks may be performed substantially concurrently, or performed in reverse order.

Although embodiments may be described by using an example in which a first conductivity type is P-type and a second conductivity type is N-type, the present invention is not limited to such examples.

In embodiments of the present disclosure, a BiCMOS device 1 (see, e.g., FIG. 1) includes a bipolar region A1 and a CMOS region A2 isolated from the bipolar region A1 by a device isolation film 160. An NPN bipolar junction transistor may be in the bipolar region A1.

Figure 1:
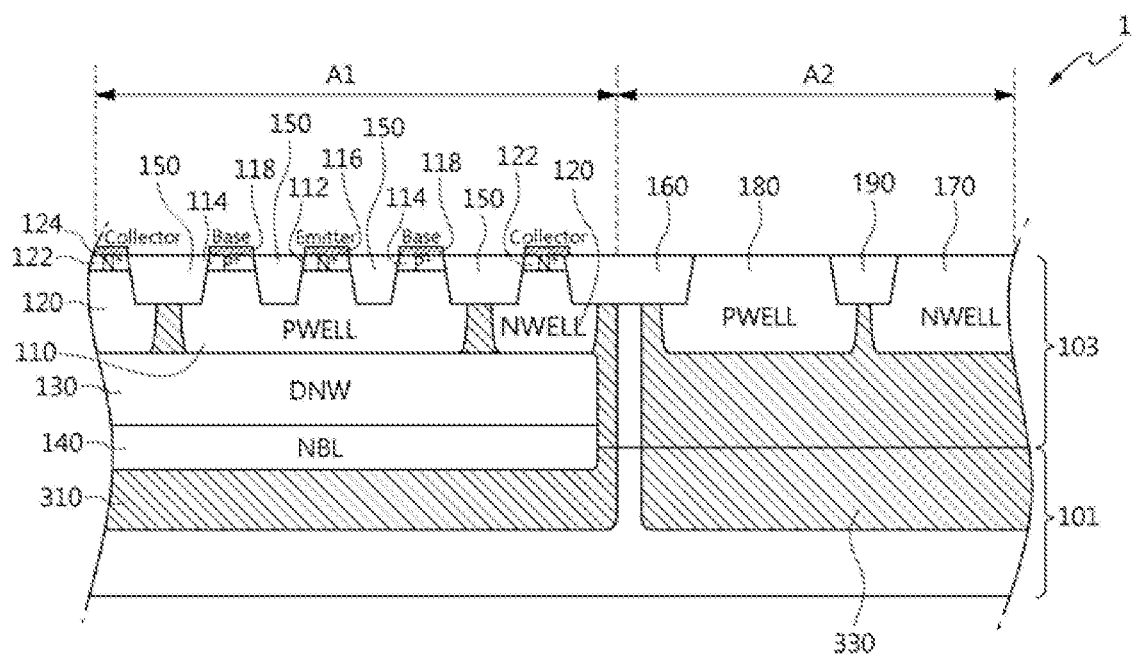
FIG. 1 is a cross-sectional view of an exemplary BiCMOS device according to one or more embodiments of the present disclosure.

FIG. 1 is a cross-sectional view of an exemplary BiCMOS device according to one or more embodiments of the present invention.

Hereinafter, a bipolar junction transistor (BJT) and a BiCMOS device including the BJT will be described in detail with reference to the accompanying drawings.

With reference to FIG. 1, embodiments of the present invention relate to a bipolar junction transistor and a BiCMOS device 1 including the bipolar junction transistor. The BiCMOS device 1 includes a bipolar region A1 and a CMOS region A2 on a lightly doped substrate 101. The lightly doped substrate 101 has first-conductivity-type deep well regions 310 and/or 330 in the bipolar region A1 and/or the CMOS region A2, thereby enhancing inter-device isolation and preventing well-to-substrate diffusion.

To fabricate the BiCMOS device, the lightly doped substrate 101 is first prepared. The substrate is a first-conductivity-type lightly doped substrate having high resistivity. Typical BiCMOS devices are made of heavily doped substrates that are doped with boron ions at a concentration of 1E15 ions/cm$^3$ or higher. However, the substrate 101 used to fabricate the BiCMOS device 1 according to the present invention is more lightly doped than such typical heavily doped substrates. The substrate 101 may have a specific electrical resistance of 1 KΩ·cm or higher.

An epitaxial layer 103 is formed on the substrate 101. In order to enhance isolation between devices (e.g., adjacent BJT and/or CMOS devices), the epitaxial layer 103 is preferably a lightly doped intrinsic epitaxial layer. Therefore, since the substrate 101 and the epitaxial layer 103 both have high resistivity values, isolation characteristics between devices are enhanced.

Hereinafter, the structure of a bipolar junction transistor in the bipolar region A1, according to embodiments of the present invention, will be described in detail.

The bipolar junction transistor according to embodiments of the present invention includes a first well region 110 and a second well region 120 in the lightly doped epitaxial layer 103. The first well region is a first-conductivity-type well region serving as a base region (e.g., of the BJT), and the second well region 120 is a second-conductivity-type well region serving as a well plug. The second well region 120 is adjacent to one side of the first well region 110. Alternatively, one or more second well regions 120 may be on opposite sides of or may surround the first well region 110. That is, a P-type well PWELL and an N-type well NWELL are in the epitaxial layer 103. Here, the first well region 110 functions as a base region. The first well region 110 is preferably a predetermined or predefined distance from the second well region 120.

A second-conductivity-type heavily doped region serving as an emitter region 112 and a first-conductivity-type doped region serving as a base contact 114 are in the first well region 110, specifically, at a surface of the first well region 110. Between the emitter region 112 and the base contact 114 is a first isolation layer 150.

A collector contact 122 is in and/or on the surface of the second well region 120. The collector contact 122 is a second-conductivity-type heavily doped region. The collector contact 122 is preferably more lightly doped than the emitter region 112.

In addition, a first deep well region 130 having a second conductivity type is below the first well region 110 and the second well region 120. That is, a deep N-type well region (DNW) serving as the first deep well region 130 is below the first and second well regions 110 and 120 in the epitaxial layer 103. The first deep well region 130 and the second well region 120 function as a collector region in conjunction with each other.

A second-conductivity-type buried layer 140 (e.g., an N-type buried layer [NBL]), is below the first deep well region 130. The buried layer 140 is near or at the boundary between the substrate 101 and the epitaxial layer 103. The buried layer 140 functions to electrically isolate the bipolar region from neighboring devices. Such electrical isolation reduces or prevents leakage current between devices (e.g., neighboring or adjacent devices). The buried layer 140 is preferably more heavily doped than the second-conductivity-type second well region 120.

In addition, silicide films 116, 118, and 124 may be on the emitter region 112, the base contact 114, and the collector contact 122, respectively. The emitter region 112 is a predetermined distance from the base contact 114, and the base contact 114 is a predetermined distance from the collector contact 122. The first isolation layer 150 is in the gap between the emitter region 112 and the base contact 114, as well as in the gap between the base contact 114 and the collector contact 112. Since the first isolation layer 150 is in contact with the first well region 110 and the second well region 120, noise attributable to stress at the interface area of the first isolation layer 150 can be greatly reduced. In addition, trapping of electrons due to trap sites at or in the interface area of the first isolation layer 150 can be reduced. In addition, a second isolation layer 160 is at the boundary between the bipolar region A1 and the CMOS region A2. The second isolation layer 160 and the first isolation layer 150 may be formed simultaneously in the same process.

Further, a CMOS device is in the CMOS region A2 that includes a third well region 170, in which a PMOS device is formed and a fourth well region 180, in which an NMOS device is formed, wherein the third well region 170 is a second-conductivity-type well region and the fourth well region 180 is a first-conductivity-type well region. The third and fourth well regions 170 and 180 are in the epitaxial layer 103 and have approximately the same depth as the first and second well regions 110 and 120. However, the depths of the third and fourth well regions 170 and 180 are not limited thereto. In addition, a third isolation layer 190 is between the third well region 170 and the fourth well region 180 and overlaps the third and fourth well regions 170 and 180.

In each of the third and fourth well regions 170 and 180, a gate electrode, a source region, and a drain region (not shown) may be folioed using a certain well-known process, and detailed descriptions thereof will be omitted.

Hereinafter, a detailed description will be given about a problem occurring in the case where the lightly doped substrate 101 having a high resistivity and the lightly doped intrinsic epitaxial layer 103 are used in combination to improve isolation characteristics.

As described above, the BiCMOS device 1 according to various embodiments of the present invention uses the high-resistivity lightly doped substrate 101 and the intrinsic epitaxial layer 103 in combination. A first-conductivity-type buried layer (e.g., to maintain a low concentration of dopant in the substrate 101) is not formed. The high-resistivity lightly doped substrate 101 can enhance isolation between devices, but is likely to suffer from well-to-substrate diffusion.

In addition, in forward active mode, the base-emitter junction is forward-biased and the collector-base junction is reverse-biased. In this state, electrons are injected into the base contact 114 from the emitter region 112, and the electrons may escape the base contact 114, passing through the first well region 110, and reaching the collector contact 122. In this mode, the electrons are likely to escape the collector region and move to neighboring devices and/or device regions by passing through the lightly doped substrate 101 and the epitaxial layer 103. This is because there is an insufficient number of holes in the substrate 101 and the epitaxial layer 103 to combine with all of the incoming electrons. This phenomenon is also likely to occur in the third well region 170 in the CMOS region A2, which will result in noise, thereby deteriorating the reliability of the devices.

Although the lightly doped first-conductivity-type substrate 101 improves isolation between devices, the expected effect of the lightly doped substrate cannot always be attained.

In order to solve this problem, the bipolar junction transistor according to various embodiments of the present invention in the bipolar region A1 may have a second deep well region (DWP) 310 that is a first-conductivity-type doped region surrounding the second well region 120, the first deep well region 130, and the buried layer 140. The second deep well region 310 is more heavily doped than the substrate 101 and the epitaxial layer 103.

In addition, in the CMOS region A2, electrodes are likely to escape the third well region 170. This also induces noise. In order to prevent this noise, a third deep well region (DPW) 330 that is a first-conductivity-type highly doped region surrounds the third well region 170. The third deep well region 330 may surround only the third well region 170, or may surround both the third well region 170 and the fourth well region 180 (e.g., to simplify the manufacturing process).

Each of the second deep well region 310 and the third deep well region 330 is a predetermined distance from the boundary between the bipolar region A1 and the CMOS region A2. That is, the second deep well region 310 and the third deep well region 330 are horizontally spaced from each other under the second isolation layer 160, thereby maintaining the low dopant concentration and high resistivity of the epitaxial layer 103 (e.g., at the interface or boundary between the bipolar region A1 and the CMOS region A2). The distance between the second deep well region 310 and the third deep well region 330 may be from 1 to 10 μm, or any value or range of values therein, but in one example is about 5 μm. This distance may depend on the concentration of dopant(s) in the second and third deep well regions 310 and 330, the time and temperature of dopant activation when forming the second and third deep well regions 310 and 330 (and/or any implant region thereafter), etc.

That is, with the first-conductivity-type deep well region(s) 310 and/or 330 (which are additional structures, as compared with conventional BiCMOS device structures), the BiCMOS device according to embodiments of the present invention can attain a noise prevention effect while enhancing isolation characteristic(s) through the use of the lightly doped substrate 101.

FIGS. 2 to 10 are cross-sectional views illustrating an exemplary sequence of manufacturing process steps of the exemplary device shown in FIG. 1.

Hereinafter, a method of manufacturing a BiCMOS device including a bipolar junction transistor will be described in detail with reference to the accompanying drawings. As described above, when embodiments can be implemented differently, functions or operations specified in specific blocks may occur in different order from the order described herein.

Figure 2:
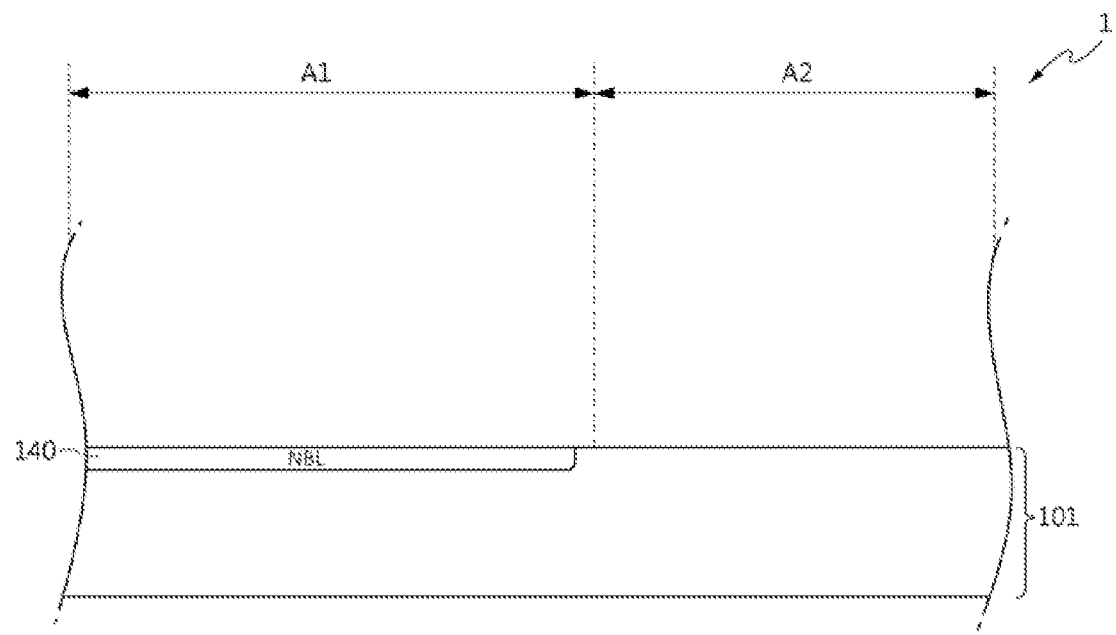
FIGS. 2 to 10 are cross-sectional views illustrating an exemplary sequence of manufacturing the exemplary BiCMOS device shown in FIG. 1.
Figure 3:
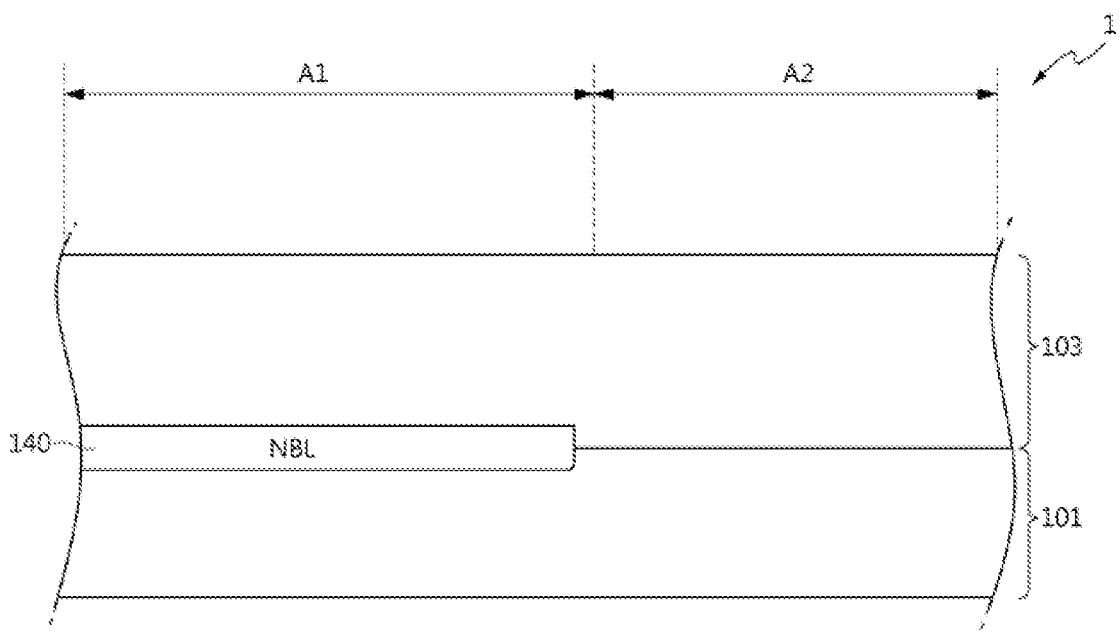

Referring to FIG. 2, second-conductivity-type impurity ions are implanted into the surface of a first-conductivity-type lightly doped substrate in a bipolar region A1 to form a second-conductivity-type buried layer 140. Next, referring to FIG. 3, a first-conductivity-type intrinsic epitaxial layer 103 (which may be lightly doped or very lightly doped) is formed through an epitaxial process on the substrate 101 having the second-conductivity-type buried layer 140 therein.

Figure 4:
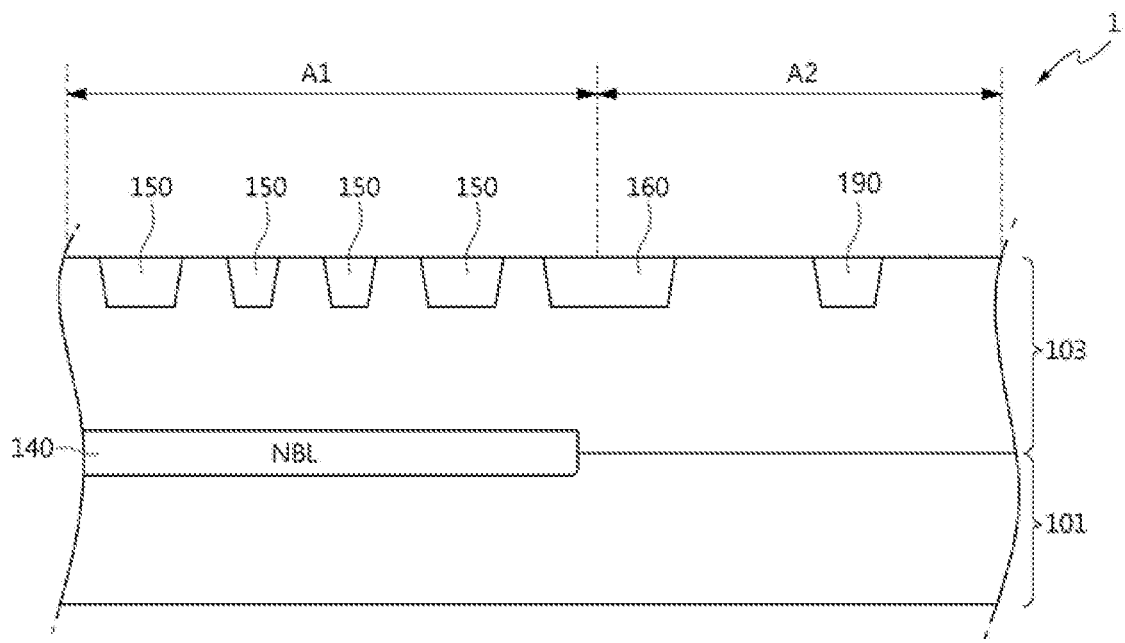

Referring to FIG. 4, a first isolation layer 150, a second isolation layer 160, and a third isolation layer 190 are formed on the surface of the epitaxial layer 103. Those isolation layers may be formed through a shallow trench isolation (STI) process, a LOCOS process, or a combination thereof. The isolation layers 150, 160 and 190 may also be formed by the same process or by different processes. The first isolation layer 150 electrically isolates each of an emitter region 112, a base contact 114, and a collector contact 122 from one another. The second isolation layer 160 is formed at the boundary between the bipolar region A1 and the CMOS region A2 to electrically isolate the bipolar region A1 and the CMOS region A2 from each other. The third isolation layer 190 electrically isolates a third well region 170 and a fourth well region 180 (e.g., the PMOS and NMOS devices) in the CMOS region A2 from each other.

Figure 5:
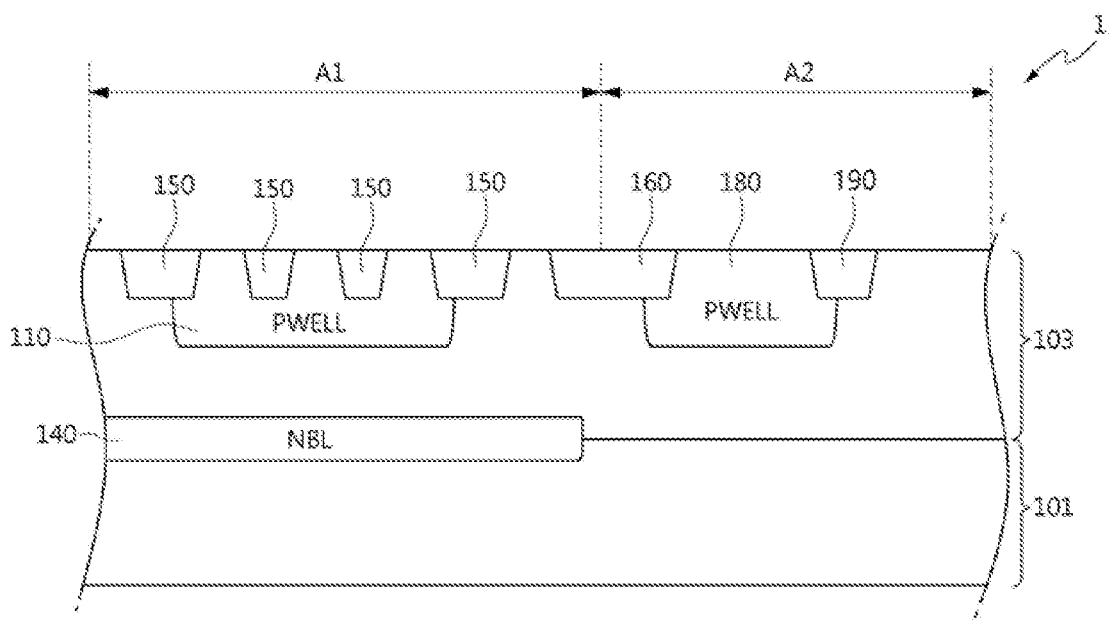

Next, referring to FIG. 5, a first well region 110 and a fourth well region 180 (the latter of which is an NMOS device region) are formed in the epitaxial layer 103 in the bipolar region A1 and the CMOS region A2, respectively. Formation of the first well region 110 and the fourth well region 180 may be performed through an ion implantation process. In greater detail, an ion implantation mask layer (not illustrated) is formed on the entire surface of the epitaxial layer 103 and then patterned to open or expose the surface of the epitaxial layer 103 in locations where the first well region 110 and the fourth well region 180 are to be famed. Next, first-conductivity-type impurity ions are implanted into the exposed surface regions of the epitaxial layer 103 to form the first well region 110 and the fourth well region 180. The ions may be implanted to form the first and fourth well regions 110 and 180 by the same masking and implantation processes, or if different characteristics are desired for the well regions 110 and 180, by different processes. Next, the ion implantation mask layer (not shown) is removed.

Figure 6:
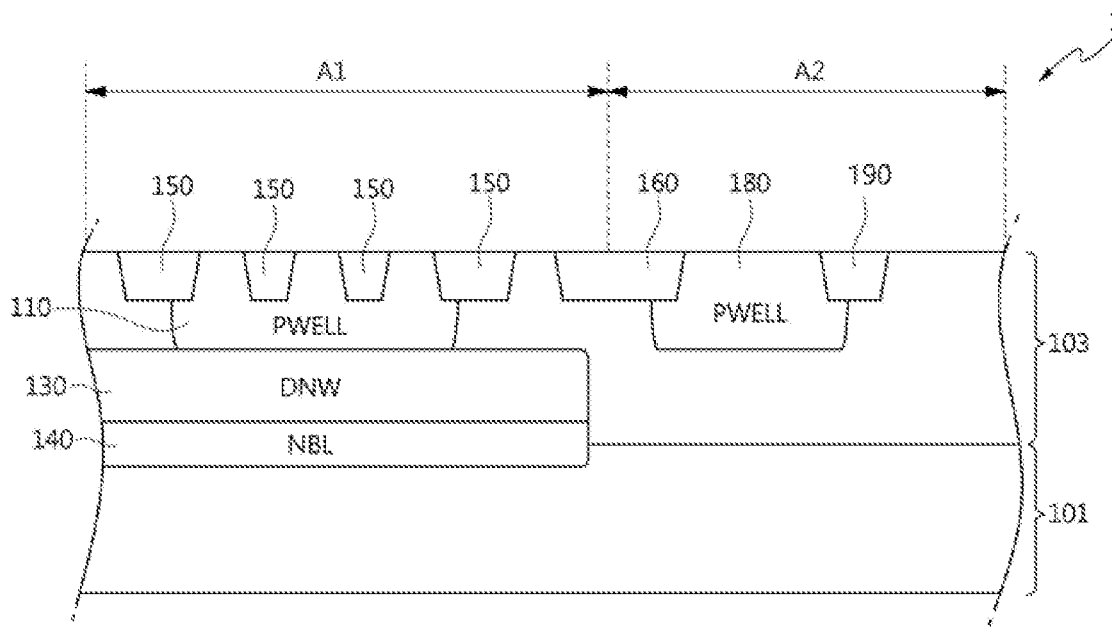

Next, referring to FIG. 6, a first second-conductivity-type deep well region 130 is foiled in the bipolar region A1 at a depth between the first well region 110 and the buried layer 140. This deep well region 130 is formed by implanting second-conductivity-type impurity ions deep into a region between the bottom of the first well region 100 and the top of the buried layer 140. For example, an ion implantation mask layer (not illustrated) is formed on the entire surface of the epitaxial layer 103 and is then patterned to open or expose the surface of the epitaxial layer 103. Next, second-conductivity-type impurity ions are implanted into the exposed surface of the epitaxial layer 103 to form the first second-conductivity-type deep well region 130. Although an example in which forming the first second-conductivity-type deep well region 130 follows forming the first well region 110 is described herein, the order of the steps is not limited thereto. That is, alternatively, the first second-conductivity-type deep well region 130 may be formed before the first well region 110 and optionally before the fourth well region.

Figure 7:
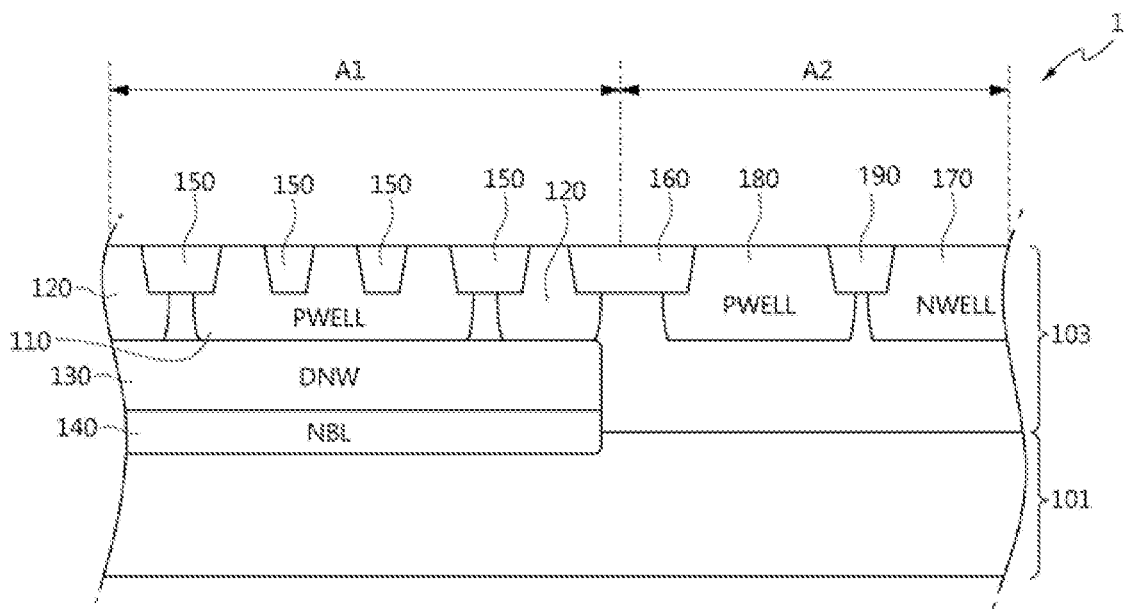

Next, referring to FIG. 7, a second second-conductivity-type deep well region 120 is formed in the epitaxial layer 103 in the bipolar region A1. For example, an ion implantation mask layer (not illustrated) is formed on the entire surface of the epitaxial layer 103 and is then patterned to expose the surface region in locations where the second second-conductivity-type deep well region 120 is to be formed. Second-conductivity-type impurity ions are implanted into the surface of the epitaxial layer 103 through the exposed surface region, thereby forming the second-conductivity-type deep well region 120 in the epitaxial layer 103. Next, the ion implantation mask layer (not illustrated) is removed. During this process performed in the bipolar region, a second ion implantation mask layer (not illustrated) is formed and patterned to partially expose the surface of the epitaxial layer in the CMOS region A2. Second-conductivity-type impurity ions are implanted through the exposed region in the epitaxial layer, thereby forming a third well region 170 having the second conductivity type. Alternatively, if the same or similar characteristics for the deep well region 120 and the third well region 170 are tolerable, the corresponding masks may be formed and the ions may be implanted in the same processes.

Figure 8:
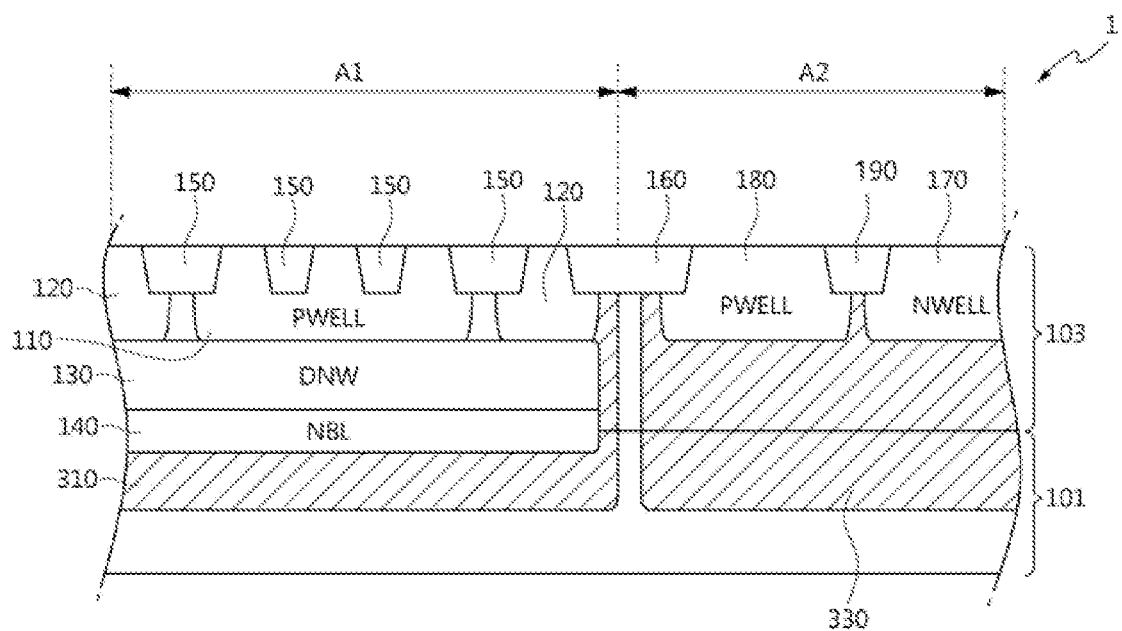

Next, referring to FIG. 8, a second deep well region 310 is formed in the epitaxial layer 103 in the bipolar region A1. The deep well region 310 is a heavily doped, first-conductivity-type region. The second deep well region 310 is more heavily doped than the substrate 101 and the epitaxial layer 103. As described above, the second deep well region 310 surrounds the second well region 120 and the first deep well region 130. In the case where the second-conductivity-type buried layer 140 is present, the second deep well region 310 surrounds the buried layer 140, as well as the second well region 120 and the first deep well region 130.

Alternatively, a third deep well region 330 may be optionally famed in the CMOS region A2 in the same process as the second deep well region 310. The third deep well region 330 surrounds only the third well region 170 or both the third well region 170 and the fourth well region 180. Both of the second deep well region 310 and the third deep well region 330 may be formed photolithographic patterning/masking and ion implantation processes.

As described above, the second deep well region 310 and the third deep well region 330 are a predetermined distance from the boundary between the bipolar region A1 and the CMOS region A2 and are spaced from each other. That is, the second deep well region 310 and the third deep well region 330 are horizontally spaced from each other under the second device isolation layer 160, thereby maintaining as much as possible the low dopant concentration and the high resistivity of the epitaxial layer 103.

Figure 9:
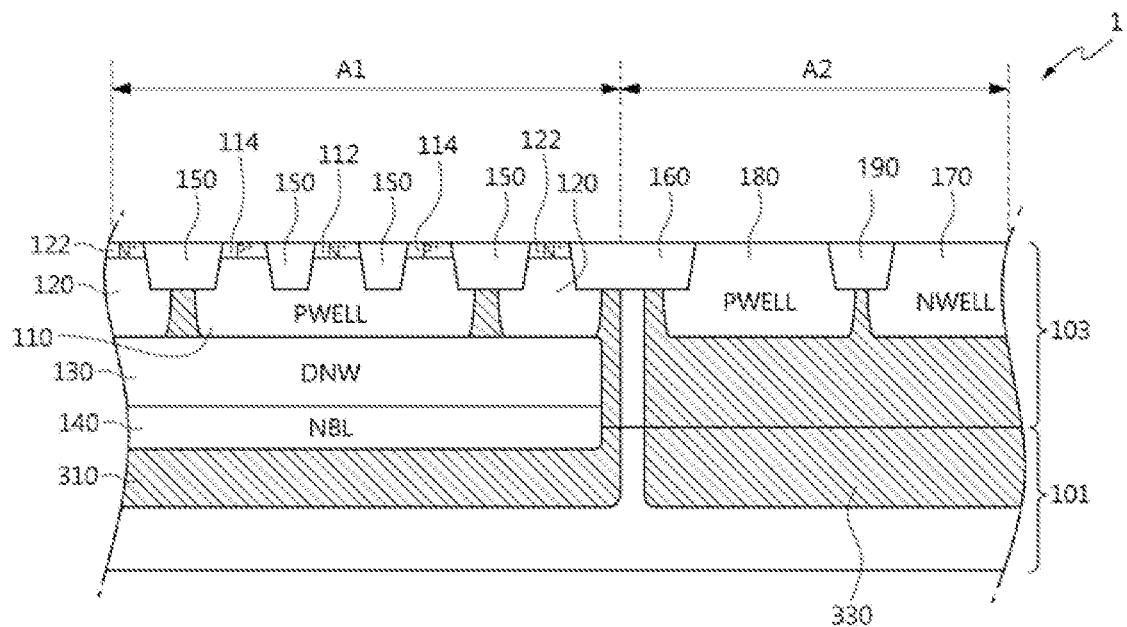

Next, referring to FIG. 9, a base contact 114 is in and/or on a surface area of the epitaxial layer 103 (e.g., in exposed peripheral areas of the first well region 110). For example, on the surface of the epitaxial layer 103, an ion implantation mask pattern with an opening corresponding to the region of the base contact 114 is formed on the epitaxial layer 103. Ion implantation is performed through the opening of the ion implantation mask pattern to form the base contact 114 (which is a heavily-doped first-conductivity-type region), and then the ion implantation mask pattern is removed.

Next, an emitter region 112 and a collector contact 122 are formed in the epitaxial layer 103. For example, an ion implantation mask pattern (not illustrated) with openings in regions corresponding to the emitter region 112 and the collector contact 122 (e.g., in an exposed center of the first well region 110 and an exposed area of the second well region 120) is formed on the surface of the epitaxial layer 103. The emitter region 112 and the collector contact 122 may be formed by performing an ion implantation process through the openings. Next, the ion implantation mask pattern is removed.

Figure 10:
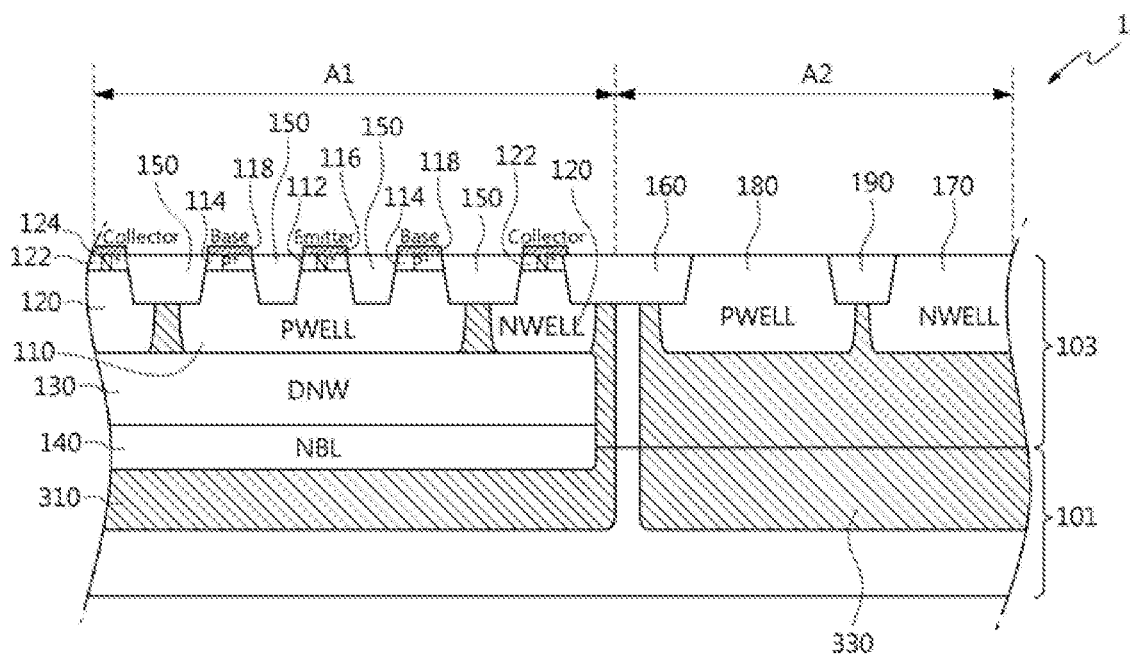

Finally, referring to FIG. 10, a silicide blocking film (not shown) with openings is formed on the surface of the epitaxial layer 103, such that the emitter region 112, the base contact 114, and the collector contact 122 are exposed through the openings. Alternatively, the silicide blocking film may cover the CMOS region A2. Next, a silicide-forming metal such as tungsten, molybdenum, chromium, titanium, cobalt, nickel, etc. is deposited (e.g., by sputtering, selective deposition, etc.) only the exposed silicon surfaces in the bipolar region A1, and a heat treatment process is performed to form the silicide films 116, 118, and 124 respectively on the emitter region 112, the base contact 114, and the collector contact 122. Next, the silicide blocking film is removed.

The above detailed description is to illustrate the present invention. In addition, the foregoing is a description about various embodiments of the present invention, and the present invention can be used in various other combinations, modifications, and environments. That is, the embodiments can be changed or modified without departing from the scope of the concept of the invention disclosed herein, the scope equivalent to the disclosed contents, and/or the scope of technology or knowledge in the art. The above-described embodiments are to convey various modes for realizing the technical spirit of the present invention, and various changes required in specific applications and uses of the present invention are possible. Accordingly, the detailed description is not intended to limit the present invention to the disclosed embodiments.

What is claimed is:

1. A bipolar junction transistor comprising:
   a substrate;
   an intrinsic epitaxial layer on the substrate;
   a first well region in the intrinsic epitaxial layer and having a first conductivity type;
   a second well region having a second conductivity type and adjacent to at least one side of the first well region;
   a first deep well region having the second conductivity type, the first deep well region being below the first and second well regions and in the intrinsic epitaxial layer;
   an emitter region and a base contact in the first well region, the emitter region and the base contact having the second conductivity type and the first conductivity type, respectively;
   a collector contact in the second well region and having the second conductivity type; and
   a second deep well region in a bipolar region of the intrinsic epitaxial layer and having the first conductivity type.

2. The bipolar junction transistor according to claim 1, wherein the first well region is spaced from the second well region.

3. The bipolar junction transistor according to claim 1, wherein the substrate has an electrical resistance exceeding 1 KΩ·cm.

4. The bipolar junction transistor according to claim 1, wherein the second deep well region surrounds the second well region and the first deep well region.

5. The bipolar junction transistor according to claim 1, further comprising a buried layer below the first deep well region and having the second conductivity type, and
   the second deep well region surrounds the second well region, the first deep well region, and the buried layer.

6. The bipolar junction transistor according to claim 4, further comprising one or more first isolation layers between the emitter region, the base contact, and the collector contact.

7. A BiCMOS device comprising:
   the bipolar junction transistor according to claim 6, in the bipolar region;
   a CMOS device in a CMOS region; and
   a second isolation layer separating the bipolar region from the CMOS region,
   wherein the CMOS device comprises:
   a third well region having the second conductivity type,
   a fourth well region having the first conductivity type, and
   a third deep well region having the first conductivity type, surrounding the third well region and the fourth well region, and having a doping concentration substantially equal to that of the second deep well region, and the third well region, the fourth well region, and the third deep well region are in the intrinsic epitaxial layer.

8. A BiCMOS device comprising:

a substrate;

an intrinsic epitaxial layer on the substrate;

a first well region in a bipolar region of the intrinsic epitaxial layer and having a first conductivity type;

a second well region having a second conductivity type and being adjacent to at least one side of the first well region, the second well region being in the bipolar region;

a first deep well region in the bipolar region, below the first and second well regions in the epitaxial layer, and having the second conductivity type;

an emitter region and a base contact in the first well region, the emitter region and the base contact having the second conductivity type and the first conductivity type, respectively;

a collector contact in the second well region and having the second conductivity type;

a second deep well region having the first conductivity type, in the bipolar region and surrounding the second well region and the first deep well region;

a third well region in a CMOS region of the epitaxial layer and having the second conductivity type;

a fourth well region in the CMOS region of the epitaxial layer and having the first conductivity type in the epitaxial layer, the fourth well region being spaced from the third well region; and a third deep well region in the CMOS region of the epitaxial layer, surrounding the third well region, and having the first conductivity type, wherein the second deep well region and the third deep well region are more heavily doped than the substrate.

9. The BiCMOS device according to claim 8, wherein the second deep well region and the third deep well region are a predetermined distance from a boundary between the bipolar region and the CMOS region.

10. The BiCMOS device according to claim 8, wherein the substrate has an electrical resistance exceeding 1 KΩ·cm.

11. The BiCMOS device according to claim 8, further comprising:

first isolation layers that separate the emitter region, the base contact, and the collector contact from one another; and one or more silicide films on the emitter region, the base contact, and the collector contact.

12. The BiCMOS device according to claim 11, further comprising a second isolation layer in the epitaxial layer at the boundary between the bipolar region and the CMOS region.

* * * * *